(12) United States Patent
Bucci et al.

(10) Patent No.: US 9,112,491 B2
(45) Date of Patent: Aug. 18, 2015

(54) IDENTIFICATION CIRCUIT AND METHOD FOR GENERATING AN IDENTIFICATION BIT USING PHYSICAL UNCLONABLE FUNCTIONS

(71) Applicant: INFINEON TECHNOLOGIES AG, Neubiberg (DE)

(72) Inventors: Marco Bucci, Graz (AT); Raimondo Luzzi, Graz (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 121 days.

(21) Appl. No.: 14/053,669

(22) Filed: Oct. 15, 2013

(65) Prior Publication Data

US 2014/0035613 A1 Feb. 6, 2014

Related U.S. Application Data

(62) Division of application No. 12/885,329, filed on Sep. 17, 2010, now Pat. No. 8,583,710.

(51) Int. Cl.
*H03K 19/00* (2006.01)
*H03K 19/003* (2006.01)
*H01L 23/544* (2006.01)

(52) U.S. Cl.
CPC ............ *H03K 19/003* (2013.01); *H01L 23/544* (2013.01); *H01L 2223/5444* (2013.01); *H01L 2223/54473* (2013.01); *H01L 2924/0002* (2013.01)

(58) Field of Classification Search
CPC .... G06F 21/76; G06F 21/78; H03K 19/17768
USPC ........................................................ 326/8
See application file for complete search history.

(56) References Cited

U.S. PATENT DOCUMENTS

| | | | | |
|---|---|---|---|---|
| 6,161,213 A | * | 12/2000 | Lofstrom | 324/750.15 |
| 6,738,788 B1 | * | 5/2004 | Horng et al. | 360/234.4 |
| 8,583,710 B2 | * | 11/2013 | Bucci et al. | 708/200 |
| 2003/0151539 A1 | * | 8/2003 | Wuidart et al. | 341/200 |
| 2003/0151942 A1 | * | 8/2003 | Bardouillet et al. | 365/148 |

FOREIGN PATENT DOCUMENTS

| | | |
|---|---|---|
| CN | 1630912 A | 6/2005 |
| CN | 101599765 A | 12/2009 |

OTHER PUBLICATIONS

Office action received for Chinese Patent Application No. 201110275241.3, mailed on Jun. 25, 2014, 8 pages of office action and 15 pages of English Translation.
Yao Yuan et al. "Design of the fully differential high speed low voltage latched comparator", Electronic Measurement Technology, vol. 32, No. 7, pp. 14-15 with its English abstract.

* cited by examiner

*Primary Examiner* — Jason M Crawford

(57) ABSTRACT

An embodiment of the present invention is an identification circuit installed on an integrated circuit for generating an identification bit, comprising a first circuit to generate a first output signal that is based on random parametric variations in said first circuit, a second circuit to generate a second output signal that is based on random parametric variations in said second circuit, a third circuit capable to be operated in an amplification mode and in a latch mode, wherein in said amplification mode the difference between the first output signal and the second output signal is amplified to an amplified value and, wherein in said latch mode said amplified value is converted into a digital signal.

11 Claims, 2 Drawing Sheets

IDENTIFICATION CIRCUIT AND METHOD FOR GENERATING AN IDENTIFICATION BIT USING PHYSICAL UNCLONABLE FUNCTIONS

CROSS-REFERENCE TO RELATED APPLICATIONS

This application is a divisional application of co-pending U.S. application Ser. No. 12/885,329, filed on Sep. 17, 2010, the contents of which are incorporated herein by reference in their entirety.

FIELD OF THE INVENTION

The present invention relates to an identification circuit and a method for generating an identification bit using physically unclonable functions.

BACKGROUND OF THE INVENTION

The invention relates generally to technology for generating a unique identification number for electronically securing electronic devices and, more particularly, to an identification circuit and a method for generating an identification bit using physically unclonable functions (PUFs). PUFs are known in the art to be implemented by circuits, components, processes or other entities capable of generating an output, such as a digital bit, word or a function that is resistant to cloning. Typically, the PUF can be generated based on inherent physical characteristics of a device such as for example individual physical characteristics of a transistor such as a threshold voltage of the transistor which varies due to local process variations during manufacturing. There is no need to store the PUF within the device, because the PUF can be generated repeatedly. It is nearly impossible to clone a device having a PUF implemented in a manner to generate the same PUF output with another device.

Security in electronic devices has become a major concern of manufacturers and users of such devices. For this it is useful to be able to distinguish each electronic device, especially the integrated circuit within these devices, from each other. This is particularly true for devices such as computers, personal hand held devices, cellular phones, chip cards, RFID-tags and other devices that contain sensitive information. Developers of electronic devices continuously strive to develop systems and methods that make their products impervious to unauthorized access or use.

At the same time, most applications have cost limitations that must be taken into account. For example, if a complicated authentication process requiring storage and computing resources were employed on an integrated circuit, the costs incurred may not justify the cost of security accomplished, particularly if the end product were a low cost and mass produced consumer product.

One approach to solve the above identified problems is to employ a PUF to provide a unique, secure bit, word or function for use in generating security keys. This may eliminate the need for storage of a public or private key on a device.

Conventional approaches have addressed such a configuration in prior art publications. One example, U.S. Pat. No. 6,161,213 discloses an identification device which is based on an array of identification cells and a circuit for measuring the output of each cell and for generating an output data function of the measured characteristics of all the elements of the array. Each cell includes two equally sized MOS transistors which are biased with the same gate-source voltage. Due to local process variations, the two transistors present different threshold voltages and, therefore, the corresponding drain currents are different. The current difference is converted to a voltage difference, amplified and compared using a precise comparator (auto-zeroing comparator).

It has been also known from Y. Su, J. Holleman, B. P. Otis, "A digital 1.6 pJ/bit chip identification circuit using process variations", IEEE J. Solid-State Circuits, vol. 43, no. 1, January 2008, to use a device based on an array of identification cells comprising a latch composed of cross-coupled inverters. Initially, both sides of the latch are pulled down. As reset is released, each latch evaluates to a state determined by the switching threshold mismatch of the two inverters.

A disadvantage of the identification device described in U.S. Pat. No. 6,161,213 is the additional circuital complexity to derive the binary output data. The identification cell described in the IEEE document from Y. Su, J. Hollemana and B. P. Otis, is less complex but not stable. For example electronic noise or a change in temperature can influence the output from the known circuits and different identification bits can occur.

What is needed is a simple identification circuit which is stable with regard to external influences.

SUMMARY

An embodiment includes an identification circuit installed on an integrated circuit for generating an identification bit, comprising a first circuit to generate a first output signal that is based on random parametric variations in the first circuit, a second circuit to generate a second output signal that is based on random parametric variations in the second circuit, a third circuit capable to be operated in an amplification mode and in a latch mode, wherein in the amplification mode the difference between the first output signal and the second output signal is amplified to an amplified value and, wherein in the latch mode the amplified value is converted into a digital signal.

A further embodiment includes a method for generating an identification bit, comprising the steps of: generating a first output signal from a first circuit which is a function of random parametric variations in the first circuit, generating a second output signal from a second circuit which is a function of random parametric variations in the second circuit, amplifying the difference between the first and the second output with a third circuit which can be operated in an amplification mode and in a latch mode and switch the third circuit in the latch mode to get a digital identification bit.

DETAILED DESCRIPTION OF THE INVENTION

Figure 1:
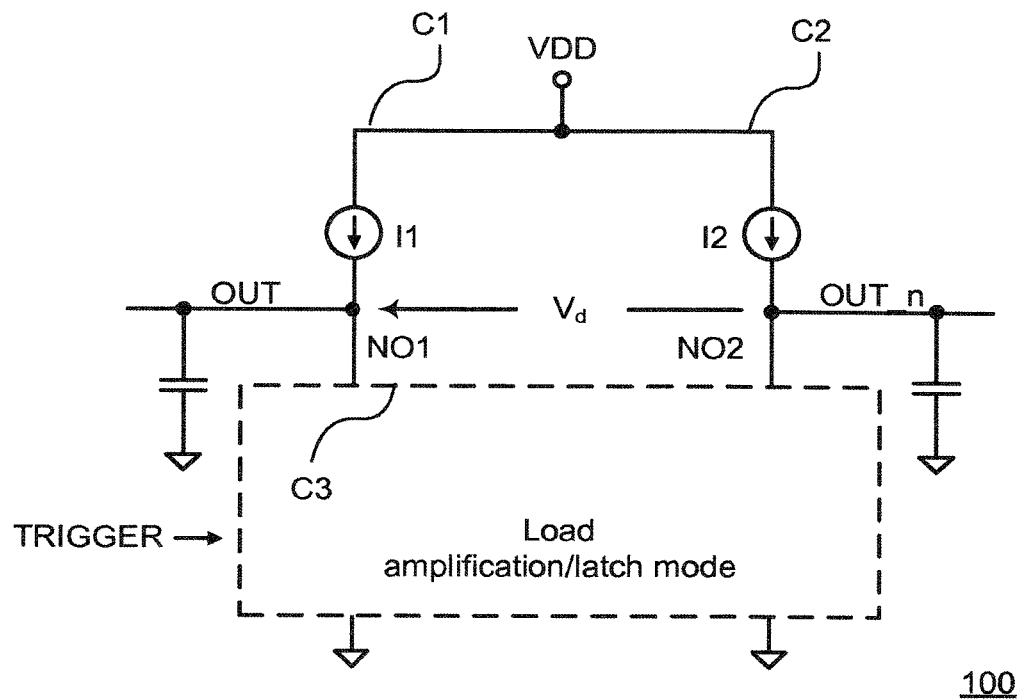
FIG. 1 shows an embodiment of an identification circuit 100

FIG. 1 shows an embodiment of an identification circuit 100 for generating an identification bit. The identification circuit 100 comprises a first circuit C1 to generate a current signal I1 which is provided via a node NO1 to a third circuit C3. Based on the current signal I1, a voltage signal OUT is generated at the node NO1 that is based on random parametric variations of one or more elements in the first circuit C1. A second circuit C2 is provided in the identification circuit 100 to generate a second current I2 which is provided via a node NO2 to the third circuit C3. The second current I2 is based on random parametric variations of at least one element in the second circuit C2. The third circuit C3 provides a load circuit and is capable to be operated in a first mode herein further referred to as an amplification mode and in a second mode herein further referred to as a latch mode. Depending on whether the third circuit C3 operates in an amplification mode or a latch mode, different stable states are obtained for the identification circuit causing for the voltage signals OUT and OUT_N at the nodes NO1 and NO2 different values in the steady states depending on the operation mode. A stable state of the circuit is obtained when the potentials and the currents at the different nodes are in a steady state, i.e. are substantially maintained at least for some time.

The amplification mode provided by the third circuit C3 is implemented in a time period prior to the digitalizing or latching of the PUF function. The amplification mode provides a better signal to noise ratio of the value to be finally digitalized as the digital PUF value by allowing prior to the digitalizing a difference between the potentials at nodes NO1 and NO2 and the different potentials to be gradually separated during the evolving into the steady state for the amplification mode. In the latch mode the separated values are then converted into a digital signal.

The Trigger signal TRIGGER causes the circuit to work either as an amplifier or as a latch. When the trigger signal TRIGGER is low, the third circuit C3 operates as an amplifier and generates a differential voltage Vd=Vout-Vout_n which is proportional to the offset I1-I2=ΔI. During the amplification mode, the output signals OUT, OUT_n are therefore analog signals. When the trigger signal TRIGGER is raised, the third circuit C3 switches to latch mode which provides the digitization or latching of the PUF signal by pulling the higher one of the two signals OUT and OUT_n to a high supply potential and the lower one of the two signals OUT and OUT_n to a low supply potential. In an embodiment, the high supply potential may be VDD and the low supply potential may be ground herein referenced as GND. The signals OUT, OUT_n are then maintained or latched at VDD or GND for providing the digital PUF value.

The amplification mode represents a first phase during which the offset between the two signals is amplified and only when the trigger signal TRIGGER arrives, the decision is taken in the latch mode on which direction the output signals OUT, OUT_n will be latched. Therefore, offset amplification and decision/digitization are two separate phases represented by the amplification mode and the latch mode. During the amplification mode which is the first phase, the third circuit C3 is not or only to a small extent sensitive to noise. OUT and OUT_n are driven to steady values which depend on the extend of the difference between the parameters which determine the PUF. In the second phase, the amplified offset is further increased to reach the maximum difference between VDD and GND. In one embodiment additional capacitances may be used to reduce the thermal noise on the output nodes NO1, NO2 during the amplification phase.

The identification circuit 100 may in an embodiment comprise a switching circuit configured to switch between the amplification mode and the latch mode of the the third circuit C3.

In one embodiment, the identification circuit 100 comprises a first transistor in the first circuit C1 wherein an operating characteristic of the first transistor is represented by the first output signal OUT. Furthermore, a second transistor is provided in the second circuit C2, wherein an operating characteristic of the second transistor is represented by the second output signal OUT_n. The transistors may for example include metal oxides semiconductor field effect transistors (MOSFETs) or other field effect transistors. The measureable output of each MOSFET pair may be in one embodiment the difference between their drain currents, which is highly susceptible to fluctuations that naturally occur in the fabrication process.

In one embodiment of the invention the identification circuit 100 comprises a first array of transistors in the first circuit C1, wherein the first output signal OUT is an operating characteristic of the first array of transistors and a second array of transistors in the second circuit C2, wherein the second output signal OUT_n is an operating characteristic of the second array of transistors.

Figure 2:
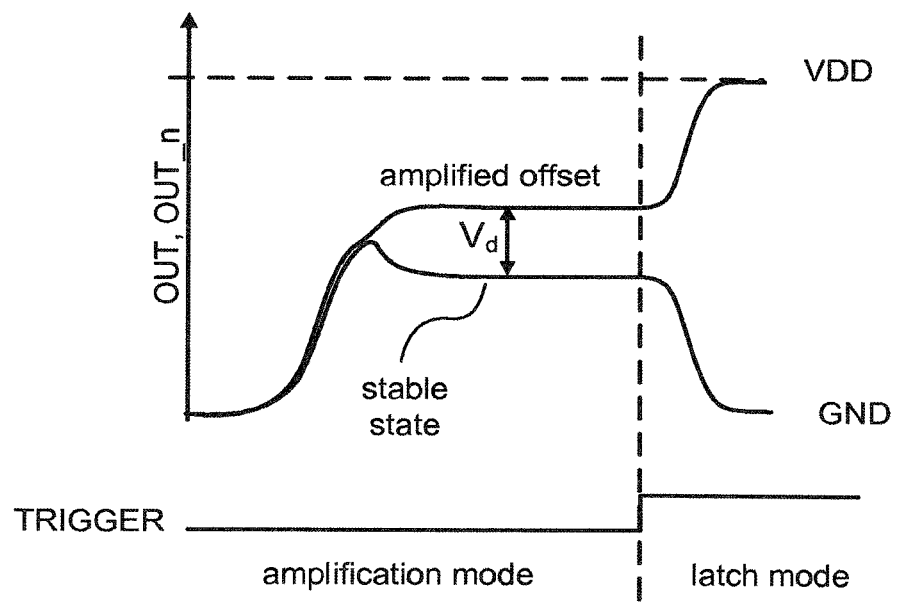
FIG. 2 is a voltage-time—diagram of an embodiment of the identification circuit 100

FIG. 2 shows an exemplary voltage-time—diagram and a trigger signal according to an embodiment. At the beginning of the determining of the PUF bit, the nodes NO1 and NO2 are forced into a predetermined state such that the voltages at both nodes NO1 and NO2 are identical for example at zero voltage. The predetermined state in which both are forced to the same potential is an unstable state for the identification circuit 100. The identification circuit 100 is configured to generate a first potential at the first output node NO1 based on the first current I1 and to generate a second potential at the second node NO2 based on the second current I2. The identification circuit 100 is configured to provide a gradually evolving of the first potential and the second potential from the unstable state into a corresponding stable state which is maintained until the end of the amplification mode. The identification circuit 100 generates based on the stable states a first latch potential at the first output node NO1 and a second latch potential at the second output node NO2 in the latch mode. In embodiments, the difference value Vd between the stable state of the first potential and the second potential is smaller than the difference value between the first latch potential and the second latch potential. The difference value Vd between the stable state of the first potential and the stable state of the second potential depends on the random parametric variations in the first circuit C1 and the second circuit C2.

Figure 3:
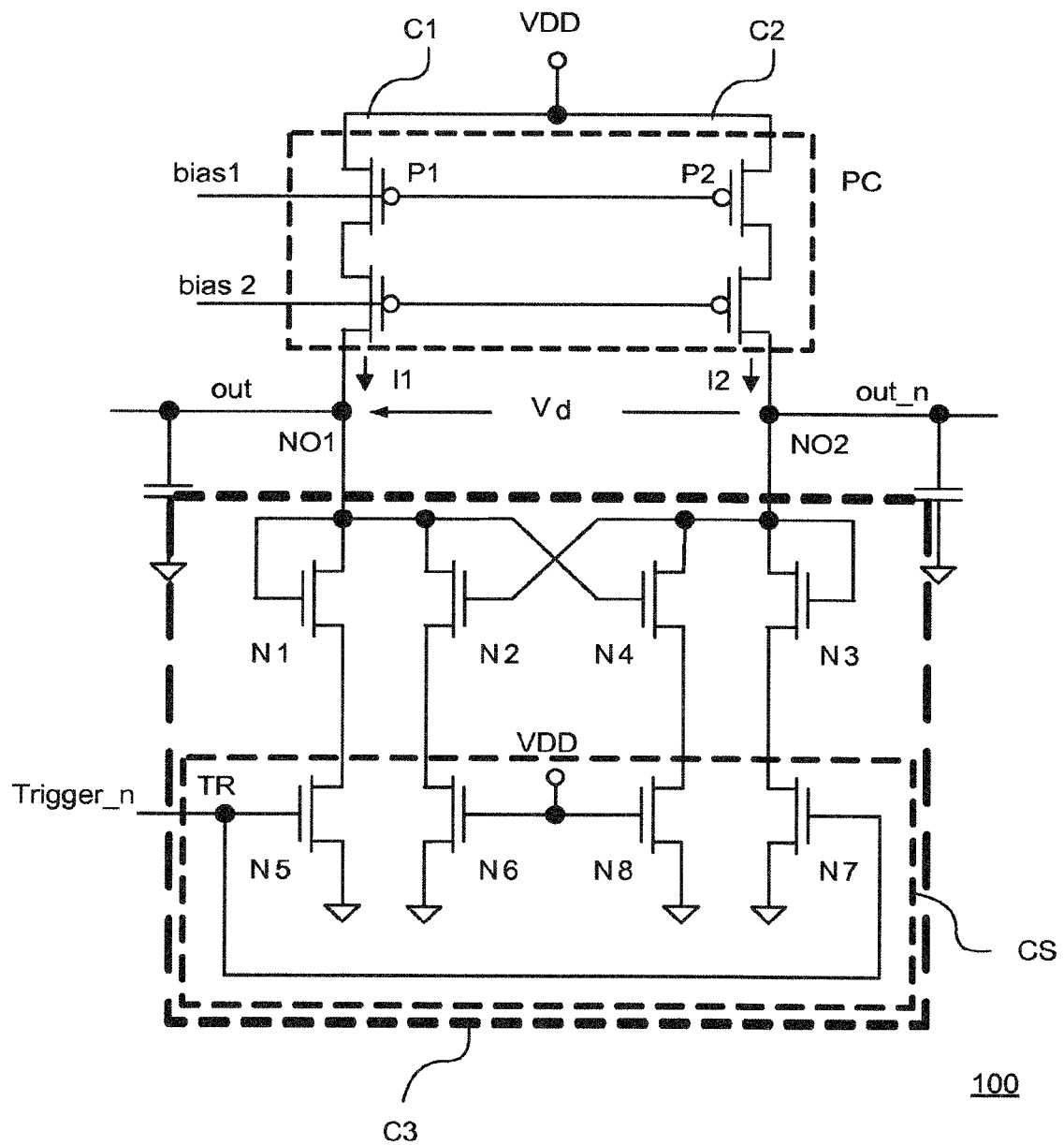
FIG. 3 shows an embodiment of an identification circuit 100

FIG. 3 shows an embodiment of an identification circuit, wherein the third circuit C3 comprises a first NMOS transistor N1, a second NMOS transistor N2, a third NMOS transistor N3 and a forth NMOS transistor N4 and the switching circuit CS comprises a fifth NMOS transistor N5, a sixth NMOS transistor N6, a seventh NMOS transistor N7 and an eighth NMOS transistor N8. The drain and the gate of the NMOS transistor N1, the drain of the NMOS transistor N2 and the gate of the NMOS transistor N4 are connected to the first output node NO1 of the first circuit C1. The drain and the gate of the NMOS transistor N3, the drain of the NMOS transistor N4 and the gate of the NMOS transistor N2 are connected to the second output node NO2 of the second circuit C2. The drain of the NMOS transistor N5 is connected to the source of the NMOS transistor N1, the drain of the NMOS transistor N6 is connected to the source of the NMOS transistor N2, the drain of the NMOS transistor N8 is connected to the source of the NMOS transistor N4, the drain of the NMOS transistor N7 is connected to the source of the NMOS transistor N3. The gates of the NMOS transistor N5 and the NMOS transistor N7 are connected to a trigger node TR to receive a trigger signal TRIGGER_n and the gates of the NMOS transistor N6 and the NMOS transistor N8 are connected to VOD.

Two nominally bias signals bias1, bias2 are provided to the PMOS cascode current mirror PC. Process variations of the current generating transistors causes a current mismatch I1−I2=ΔI. In an embodiment minimum area well-matched transistors are used in order to avoid systematic offset.

The third circuit C3 is implemented by means of the four matched NMOS transistors N1, N2, N3, N4. NMOS transistor N1 and the NMOS transistor N3 are diode-connected thus behaving as positive impedance, while the second NMOS transistor N2 and the fourth NMOS transistor N4 are cross-coupled and, regarding differential mode, can be seen as negative impedances.

The NMOS transistors N5, N6, N7 and N8 are used in this embodiment to implement the switching between amplification and latch mode. The actual switching is implemented by the fifth NMOS transistor N5 and the seventh NMOS transistor N7, where the fifth NMOS transistor N5 and the seventh NMOS transistor N7 are triggered over a trigger node TR with an inverted trigger signal TRIGGER_n. The NMOS transistors N6 and N8 are provided to preserve the matching between the NMOS transistor N1 to the NMOS transistor N2 and the NMOS transistor N3 to the NMOS transistor N4 but have otherwise no other function. The gates of transistors N6 and N8 are connected to VDD which causes them to be always active.

During amplification mode the inverted trigger signal TRIGGER_n is "1" setting NMOS transistors N5 and N7 to be active.

At the beginning of the amplification mode, the nodes NO1 and NO2 are forced to the same potential for example 0 V and thereafter released. After releasing, the node NO1 is charged by current I1 and the node NO2 is charged by current I2 causing an increase of the potentials at nodes NO1 and NO2. Already a slight difference in the currents I1 and I2 will cause a difference in the potentials at nodes NO1 and NO2. Assuming for example current I1 to be slightly higher than current I2, node NO1 will sooner be at the NMOS transistor threshold potential. In other words NMOS transistors N1 and N4 become active before NMOS transistors N2 and N3 become active.

Once NMOS transistors N1, N2, N3 and N4 have become active, the positive admittances due to the NMOS transistor N1 and the NMOS transistor N3 cancel the negative differential admittances due to the NMOS transistor N2 and the NMOS transistor N4 respectively. It can be shown that when currents I1 and I2 have different values, an asymmetric stable state is obtained in which the potentials at NO1 and NO2 are different when realistic properties of NMOS transistors are assumed. Transistors N1 and N3 act in view of the gate connection as a diode. Therefore, distinguished from the latch mode, the nodes NO1 and NO2 are biased via the transistors N1 and N3 acting as diodes. This configuration causes the circuit to reach a stable state wherein the potentials at NO1 and NO2 are different but are neither pulled to VDD nor to OND as in a latch.

The amplification can then be determined by the difference in the conductance values of the diode transistors and the positive feedback transistors. Denoting the conductance for transistors N1, N2, N3 and N4 as gm1, gm2, gm3 and gm4 it can be assumed that (gm1−gm4)=(gm3−gm2)=Δgm since the "diode transistors" N1 and N3 correspond and match in the same way as the "cross-coupled transistors" N4 and N2.

Then, from $$I_+ + I_- = gm1*V_+ + gm2*V_- - gm3*V_- - gm4*V_+ ==$$
$$(gm1-gm4)*V_+ - (gm3-gm2)*V_- = \Delta gm*(V_+ - V_-)$$

we get Zd=1/Δgm,
and for the amplification of I+ + I− = ΔIbias, i.e. the differential output voltage, results Vout−Vout_n=Vd=Zd*ΔIbias=ΔIbias/Δgm.

In the amplification mode, noise can be filtered and the dynamic effects that could occur during its activation are rejected. Capacitances can be connected to the nodes NO1 and NO2 as shown in FIG. 3 for further filtering and reducing the impact of noise thereby increasing the circuit robustness. The capacitances can be added without having a negative effect on the amplified offset and the decision security is not affected even when the capacitances are not matched since the latch mode is only triggered when the steady state in the amplification mode has been reached in which the potentials at the nodes NO1 and NO2 are sufficiently separated.

In other words, while in the latching of a pure latch starting from equal potentials at nodes NO1 and NO2 the decision can be reversed by slight change of the potentials or currents due to noise, the amplification mode allows such effects to be canceled at least better than in the latch mode. The extent to which the amplification mode is capable to tolerate noise depends on the ration of the noise intensity to mismatch. Basically, in a pure latch mode the circuit will decide its state depending on whether node NO1 or NO2 rises faster. This can also depend on several parasitic effects not only on the static current mismatch between I1 and I2.

The latch mode starts when the inverted trigger signal TRIGGER_n falls to "0" causing the NMOS transistors N5 and N7 to shut down. With the NMOS transistors N5 and N7 shut down, no current is drawn by NMOS transistors N1 and N3. Therefore the cross-coupled NMOS transistor N2 and NMOS transistor N4 make the load operate straightforward as a latch. As described above, in the latch mode the decision in which direction the latch latches is depending on which of the nodes NO1 and NO2 charges faster to the threshold potential at which N2 and N4 become active. Since the potential at the nodes NO1 and NO2 are already sufficiently separated due to previous amplifying mode at the starting of the latch mode, the latching is less prone to noise and the reversal of a latching due to noise is less likely to occur.

While in the above only a single identification circuit has been described, it is to be understood that in one embodiment an electronic device may comprise a plurality of identification circuits 100 as described above for generating an unique identification code composed by the identification bits. The identification code will be unique for each device, even though all devices from a series are fabricated using the same production facilities as well as identical masks. Like the identification bit, the identification code is based on random, parametric variations which occur during the fabrication process. When the number of identification bits is large enough, billions of devices can be provided with a unique identification code without having to customize each device.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This detailed description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that embodiments described in combination with specific entities may in addition to an implementation in these entity also include one or more implementations in one or more sub-entities or sub-divisions of the described entity.

The accompanying drawings that form a part hereof show by way of illustration, and not of limitation, specific embodiments in which the subject matter may be practiced.

In the foregoing detailed description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the detailed description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended.

It is further to be noted that methods disclosed in the specification or in the claims may be implemented by a device having means for performing each of the respective steps of these methods.

What is claimed is:

1. An identification circuit installed on an integrated circuit for generating an identification bit, comprising:
   a first circuit to generate a first output signal that is based on random parametric variations in said first circuit,
   a second circuit to generate a second output signal that is based on random parametric variations in said second circuit,
   a third circuit capable to be operated in an amplification mode and in a latch mode, wherein in said amplification mode the difference between the first output signal and the second output signal is amplified to an amplified value and,
   wherein in said latch mode said amplified value is converted into a digital signal.

2. The identification circuit of claim 1, further comprising:
   a switching circuit, wherein the switching circuit is designed to switch between said amplification mode and said latch mode of the said third circuit.

3. The identification circuit of claim 1, further comprising:
   a first transistor in said first circuit, wherein said first output signal is an operating characteristic of said first transistor and
   a second transistor in said second circuit wherein said second output signal is an operating characteristic of said second transistor.

4. The identification circuit of claim 3, wherein said transistors are metal oxides semiconductor field effect transistors (MOSFETs).

5. The identification circuit of claim 1, further comprising:
   a first array of transistors in said first circuit, wherein said first output signal is an operating characteristic of said first array of transistors and
   a second array of transistors in said second circuit, wherein said second output signal is an operating characteristic of said second array of transistors.

6. The identification circuit of claim 1, wherein said first output signal is a first current and said second output signal is a second current.

7. The identification circuit of claim 1, wherein said identification circuit is configured to generate a first potential at a first node based on said first output signal and to generate a second potential at a second node based on said second output signal and wherein said identification circuit is configured to provide a gradually evolving of said first and said second potentials into a corresponding stable state and to generate based on said stable states a first latch potential at said first node and a second latch potential at said second node in the latch mode.

8. The identification circuit of claim 7, wherein the difference value between the stable state of said first potential and said second potential is smaller than the difference value between the first latch potential and the second latch potential.

9. The identification circuit of claim 7, wherein the difference value between said stable state of said first potential and said stable state of said second potential dependents on the random parametric variations in said first circuit and said second circuit.

10. Electronic device comprising a plurality of identification circuits of claims 1 for generating an identification code composed by said identification bits.

11. A method for generating an identification bit, comprising:
    generating a first output signal from a first circuit which is a function of random parametric variations in said first circuit,
    generating a second output signal from a second circuit which is a function of random parametric variations in said second circuit,
    amplifying said first output and said second output with a third circuit which can be operated in an amplification mode and in a latch mode,
    switch said third circuit in the latch mode to get a digital identification bit.

* * * * *

UNITED STATES PATENT AND TRADEMARK OFFICE
CERTIFICATE OF CORRECTION

| | | |
|---|---|---|
| PATENT NO. | : 9,112,491 B2 | Page 1 of 1 |
| APPLICATION NO. | : 14/053669 | |
| DATED | : August 18, 2015 | |
| INVENTOR(S) | : Marco Bucci et al. | |

It is certified that error appears in the above-identified patent and that said Letters Patent is hereby corrected as shown below:

In the claims

Claim 9 - Column 8, line 44: delete "second potential dependents on the random" and insert --second potential depends on the random-- in place thereof.

Signed and Sealed this
Seventh Day of June, 2016

Michelle K. Lee
*Director of the United States Patent and Trademark Office*